United States Patent
Tseng et al.

(10) Patent No.: US 7,659,844 B2
(45) Date of Patent: Feb. 9, 2010

(54) OPTICAL-TO-ELECTRICAL CONVERTER AND ANALOG-TO-DIGITAL CONVERTER THEREOF

(75) Inventors: Hung-Wei Tseng, Hsinchu (TW);
Ling-Chang Hu, Hsinchu (TW);
Shi-Hsiang Lu, Hsinchu (TW);
Wein-Town Sun, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 102 days.

(21) Appl. No.: 11/962,094

(22) Filed: Dec. 21, 2007

(65) Prior Publication Data
US 2009/0028570 A1    Jan. 29, 2009

(30) Foreign Application Priority Data
Jul. 27, 2007    (TW)    ................................ 96127474 A (51) Int. Cl.
*H03M 1/56* (2006.01)
(52) U.S. Cl. ..................... 341/169; 341/136; 341/155
(58) Field of Classification Search ................ 341/136, 341/155, 169
See application file for complete search history.

(56) References Cited

U.S. PATENT DOCUMENTS

| | | | |
|---|---|---|---|
| 4,518,880 A | 5/1985 | Masuda et al. | |
| 5,982,318 A | 11/1999 | Yiannoulos | |
| 6,943,719 B2* | 9/2005 | Yun et al. | 341/155 |
| 7,250,897 B2* | 7/2007 | Oh | 341/169 |
| 7,408,138 B2* | 8/2008 | Lee | 250/208.1 |
| 2006/0044171 A1 | 3/2006 | Noguchi | |
| 2006/0063649 A1 | 3/2006 | Allison | |
| 2006/0097899 A1 | 5/2006 | Nagai | |

\* cited by examiner

*Primary Examiner*—Khai M Nguyen
(74) *Attorney, Agent, or Firm*—Jianq Chyun IP Office (57) ABSTRACT

An analog-to-digital converter (ADC) for converting an optical signal into an electrical signal is disclosed. The ADC includes a detection module, a first P-type metal oxide semiconductor (PMOS) transistor, a first N-type metal oxide semiconductor (NMOS) transistor, a first switch unit, and an output module. The first PMOS transistor and the first NMOS transistor form an inverter. The first switch unit is disposed between the input terminal and the output terminal of the inverter and is turned on/off according to a first control signal. The output module is coupled to the output terminal of the inverter for counting the time that an input voltage is greater than a reference voltage and generating a digital signal.

15 Claims, 5 Drawing Sheets

OPTICAL-TO-ELECTRICAL CONVERTER
AND ANALOG-TO-DIGITAL CONVERTER
THEREOF

CROSS-REFERENCE TO RELATED
APPLICATION

This application claims the priority benefit of Taiwan application serial no. 96127474, filed on Jul. 27, 2007. The entirety of the above-mentioned patent application is hereby incorporated by reference herein and made a part of this specification.

BACKGROUND OF THE INVENTION

1. Field of the Invention

The present invention relates to an analog-to-digital converter (ADC), and in particular, to an ADC for converting an optical signal into an electrical signal.

2. Description of Related Art

Figure 1:
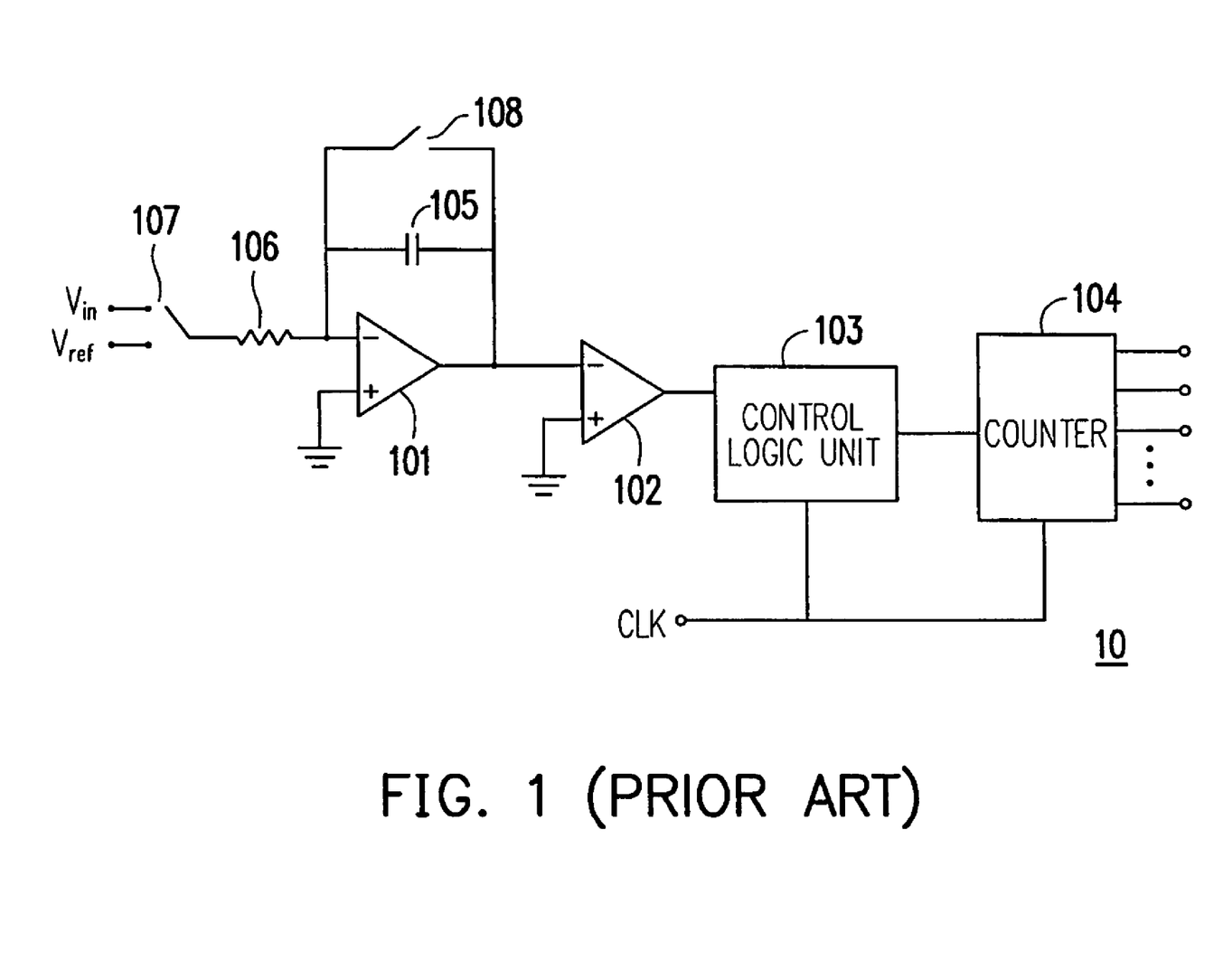
FIG. 1 is a circuit block diagram of a conventional analog-to-digital converter (ADC).

FIG. 1 is a circuit block diagram of a conventional analog-to-digital converter (ADC). Referring to FIG. 1, the conventional ADC 10 includes two comparators 101 and 102, a control logic unit 103, a counter 104, a capacitor 105, a resistor 106, and two switch units 108 and 107. One terminal of the switch unit 107 is selectively coupled to an input voltage $V_{in}$ or a reference voltage $V_{ref}$ and the other terminal thereof is coupled to the negative input terminal of the comparator 101 through the resistor 106. The positive input terminal of the comparator 101 is grounded, and the output terminal thereof is coupled to the negative input terminal of the comparator 101 through the capacitor 105. The switch unit 108 spans over the capacitor 105, and the capacitor 105 is short-circuited when the switch unit 108 is turned on.

Additionally, the output terminal of the comparator 101 is coupled to the negative input terminal of the comparator 102. The positive input terminal of the comparator 102 is grounded, and the output terminal thereof is coupled to the control logic unit 103. Accordingly, the control logic unit 103 can control the switch unit 107 to couple the negative input terminal of the comparator 101 to the input voltage $V_{in}$ or the reference voltage $V_{ref}$ and control the on/off of the switch unit 108 according to the output of the comparator 102 and a clock signal CLK. In addition, the output terminal of the control logic unit 103 is coupled to the counter 104 so that the counter 104 counts the clock signal CLK according to the output of the control logic unit 103 and generate a digital signal.

In general, the comparators 101 and 102 are respectively composed of a plurality of transistors. However, if these transistors are fabricated through low temperature poly-silicon processes, the threshold voltages of the transistors will drift along the operation time thereof. Incorrect digital signal may be output by the counter 104 if the threshold voltages of the comparators 101 and 102 drift.

To resolve foregoing problem and optimize the conversion from an analog signal to a digital signal, an ADC with reduced transistor threshold voltage drift is provided by the present invention.

SUMMARY OF THE INVENTION

Accordingly, the present invention is directed to an analog-to-digital converter (ADC), wherein transistor threshold voltage drift in the comparators is reduced and the power consumption of the comparators is also reduced.

The present invention is directed to an optical-to-electrical converter having an ADC, wherein a large optical current range can be detected and a large dynamic range to be detected by a detector is provided.

The present invention provides an ADC including a first P-type metal oxide semiconductor (PMOS) transistor, a first N-type metal oxide semiconductor (PMOS) transistor, a first switch unit, an output module, a source follower, a capacitor, a second switch unit, and a third switch unit. The first terminal of the first PMOS transistor is coupled to a first bias, the second terminal thereof is coupled to the first terminal of the first NMOS transistor, and the gate terminal thereof is selectively coupled to an input voltage or a reference voltage.

The first terminal and the gate terminal of the first NMOS transistor are respectively coupled to the second terminal and the gate terminal of the first PMOS transistor, so that the first NMOS transistor and the first PMOS transistor form an inverter for inverting an input signal. Besides, the second terminal of the first NMOS transistor is grounded.

The first switch unit is disposed between the second terminal and the gate terminal of the first PMOS transistor. The first terminal of the first switch unit is coupled to the gate terminal of the first PMOS transistor, the second terminal thereof is coupled to the second terminal of the first PMOS transistor, and the gate terminal thereof receives a first control signal. The first switch unit is turned on/off according to the first control signal.

The output module is coupled to the first terminal of the first NMOS transistor for counting the time that the input voltage is greater than the reference voltage and generating a digital signal.

The capacitor is disposed between the gate terminal of the first PMOS transistor and the output terminal of the source follower. The output terminal of the source follower is coupled to the capacitor and the input terminal thereof is coupled to the input voltage through the second switch unit. Besides, the input terminal of the source follower is coupled to the reference voltage through the third switch unit.

One terminal of the second switch unit receives the input voltage, and the other terminal thereof is coupled to the input terminal of the source follower. The second switch unit is turned on/off according to a second control signal. One terminal of the third switch unit receives the reference voltage, and the other terminal thereof is coupled to the input terminal of the source follower. The third switch unit is turned on/off according to the first control signal, wherein the first control signal and the second control signal are inverted to each other.

The present invention provides an optical-to-electrical converter including a detection module, a first PMOS transistor, a first NMOS transistor, a first switch unit, and an output module. The first terminal of the first PMOS transistor is coupled to a first bias, and the gate terminal thereof is selectively coupled to a reference voltage or the detection module. The detection module detects the surrounding light intensity and generates an input voltage which is received by the gate terminal of the first PMOS transistor.

According to an embodiment of the present invention, the second terminal of the first NMOS transistor is grounded, and the first terminal and the gate terminal thereof are respectively coupled to the second terminal and the gate terminal of the first PMOS transistor, so that the first NMOS transistor and the first PMOS transistor form an inverter for inverting an input signal. The first switch unit is disposed between the second terminal and the gate terminal of the first PMOS transistor and is turned on/off according to a first clock signal. The output module is coupled to the first terminal of the first NMOS transistor for counting a time that the input voltage is greater than the reference voltage and generating a digital signal.

In an ADC provided by the present invention, a first switch unit is disposed in the inverter formed by a PMOS transistor and an NMOS transistor. The first switch unit is disposed between the input terminal and the output terminal of the inverter. When the first switch unit is turned on, the voltage levels at the input terminal and the output terminal of the inverter are the same such that a straight line having a slope of 45° is formed in the electrical characteristic graph of the inverter and this straight line intersects the electrical characteristic curve of the inverter at a particular point. The voltage value at this point will not drift along the operation time of the inverter, thus, the affection caused by threshold voltage drift to the comparators can be reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
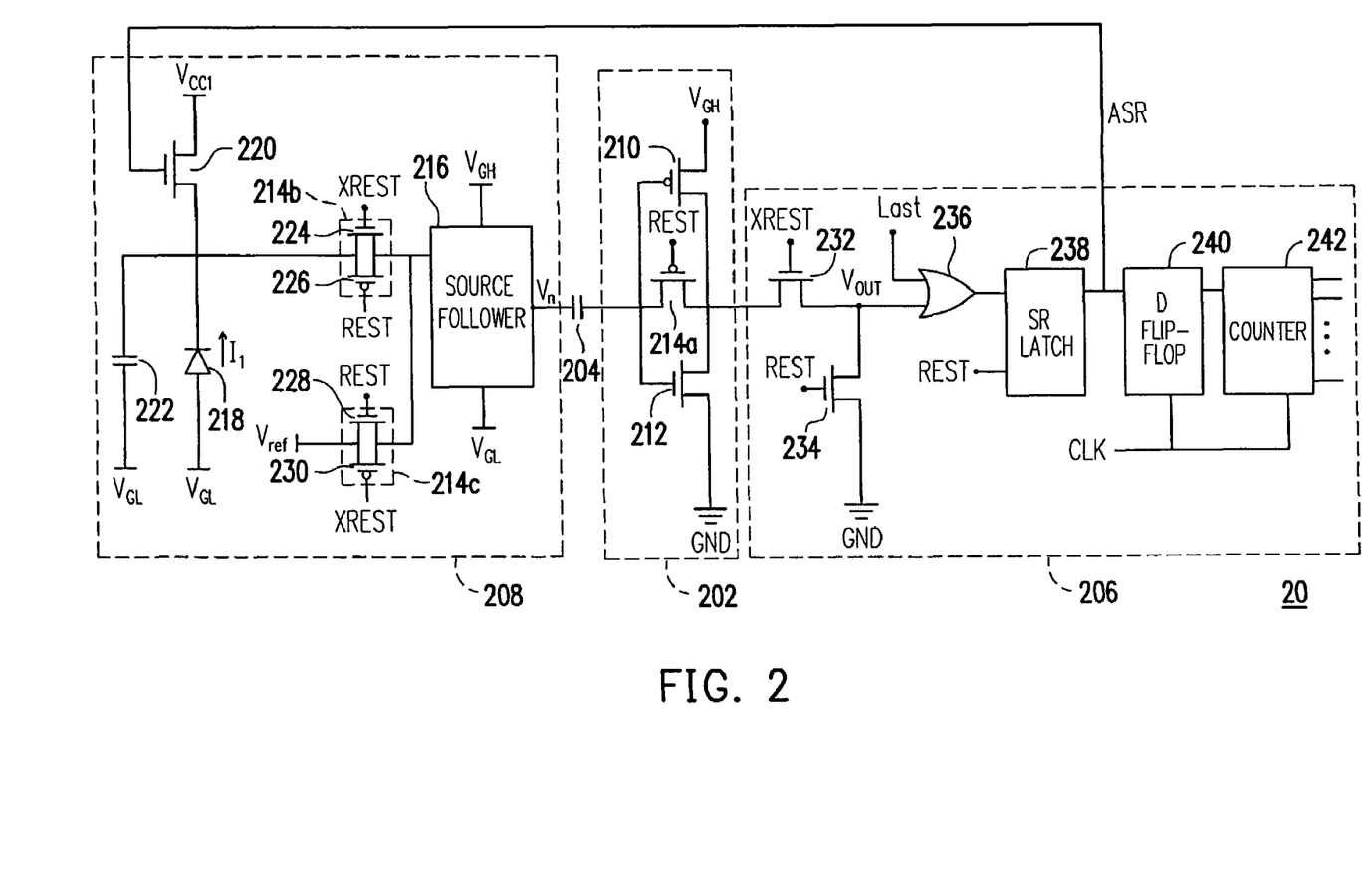
FIG. 2 is a circuit block diagram of an ADC according to an embodiment of the present invention.

FIG. 2 is a circuit block diagram of an analog-to-digital converter (ADC) 20 according to an embodiment of the present invention. Referring to FIG. 2, the ADC 20 may be an optical-to-electrical converter which includes an inverter 202, a capacitor 204, a detection module 208, and an output module 206. The input terminal of the inverter 202 is coupled to the output terminal of the detection module 208 through the capacitor 204, and the output terminal of the inverter 202 is coupled to the input terminal of the output module 206. The output module 206 further issues an asynchronous latch signal ASR to the detection module 208.

In the present embodiment, the inverter 202 includes a PMOS transistor 210 and an NMOS transistor 212. The first terminal of the PMOS transistor 210 is coupled to a first bias $V_{GH}$, the second terminal thereof is coupled to the output terminal of the inverter 202, and the gate terminal thereof is coupled to the input terminal of the inverter 202. The first terminal of the NMOS transistor 212 is coupled to the output terminal of the inverter 202, the second terminal thereof is grounded, and the gate terminal thereof is coupled to the output terminal of the inverter 202.

In particular, a switch unit 214a spans over the input terminal and the output terminal of the inverter 202. In the present embodiment, the switch unit 214a may be an NMOS transistor, wherein the first terminal of the NMOS transistor is coupled to the input terminal of the inverter 202, the second terminal thereof is coupled to the output terminal of the inverter 202, and the gate terminal thereof receives a control signal REST.

The output module 206 includes NMOS transistors 232 and 234, an OR gate 236, a SR latch 238, a D flip-flop 240, and a counter 242. The first terminal of the NMOS transistor 232 is coupled to the input terminal of the output module 206, the second terminal thereof is coupled to an input terminal of the OR gate 236, and the gate terminal thereof is coupled to a control signal XREST. The first terminal of the NMOS transistor 234 is coupled to the second terminal of the NMOS transistor 232, the second terminal thereof is grounded, and the gate terminal thereof is coupled to the control signal REST. The other input terminal of the OR gate 236 is coupled to a set signal Last, and the output terminal thereof is coupled to the set terminal of the SR latch 238.

The set terminal of the SR latch 238 is coupled to the output terminal of the OR gate 236, and the output terminal thereof is coupled to the D flip-flop 240. The SR latch 238 generates the asynchronous latch signal ASR according to the output of the OR gate 236. The output of the D flip-flop 240 is coupled to the counter 242. The counter 242 generates a digital signal according to the output of the D flip-flop 240 and a clock signal CLK.

The detection module 208 includes a source follower 216, a switch unit 214b, a switch unit 214c, an NMOS transistor 220, a photo detector 218, and a capacitor 222. The photo detector 218 may be implemented with a photo diode, wherein the anode of the diode is coupled to a bias $V_{GL}$, and the cathode thereof is coupled to the input terminal of the source follower 216 through the switch unit 214b. The output terminal of the source follower 216 is coupled to the output terminal of the detection module 208.

The first terminal of the NMOS transistor 220 is coupled to a bias $V_{CC1}$, the second terminal thereof is coupled to the cathode of the photo detector 218, and the gate terminal thereof receives the asynchronous latch signal ASR. One terminal of the capacitor 222 is coupled to the cathode of the photo detector 218, and the other terminal thereof is coupled to the bias $V_{GL}$. The reference voltage $V_{ref}$ is coupled to the input terminal of the source follower 216 through the switch unit 214c.

The switch unit 214b in the detection module 208 includes a PMOS transistor 226 and an NMOS transistor 224. The first terminal of the PMOS transistor 226 is coupled to the cathode of the photo detector 218, the second source/drain thereof is coupled to the input terminal of the source follower 216, and the gate terminal thereof is coupled to the control signal REST. The first terminal of the NMOS transistor 224 is coupled to the cathode of the photo detector 218, the second terminal thereof is coupled to the input terminal of the source follower 216, and the gate terminal thereof is coupled to the control signal XREST.

The switch unit 214c includes a PMOS transistor 230 and an NMOS transistor 228. The first terminal of the PMOS transistor 230 is coupled to the reference voltage $V_{ref}$, the second source/drain thereof is coupled to the input terminal of the source follower 216, and the gate terminal thereof is coupled to the control signal XREST. The first terminal of the NMOS transistor 228 is coupled to the reference voltage $V_{ref}$, the second terminal thereof is coupled to the input terminal of the source follower 216, and the gate terminal thereof is coupled to the control signal REST. The control signal REST and the control signal XREST are inverted to each other, thus, the switch unit 214c is turned off when the switch unit 214b is turned on.

Below, the implementation of the source follower 216 in the present embodiment will be described with reference to an embodiment of the present invention.

Figure 3:
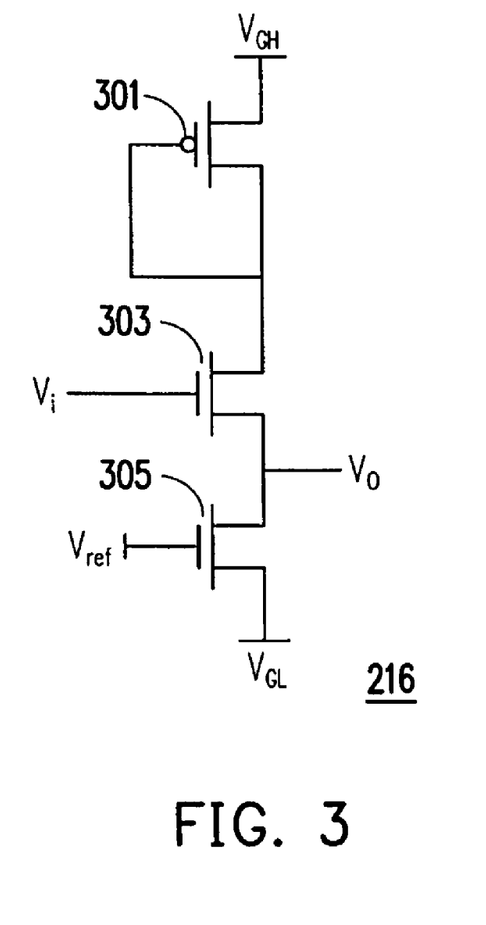
FIG. 3 is a circuit diagram of a source follower according to an embodiment of the present invention.

FIG. 3 is a circuit diagram of a source follower 216 according to an embodiment of the present invention. Referring to FIG. 3, the source follower 216 includes a PMOS transistor 301 and NMOS transistors 303 and 305. The gate terminal of the NMOS transistor 303 is coupled to the input terminal of the source follower 216, the first terminal thereof is coupled to the second terminal of the PMOS transistor 301, and the second terminal thereof is coupled to the output terminal of the source follower 216. The first terminal of the PMOS transistor 301 is coupled to a bias $V_{GH}$, and the gate terminal of the PMOS transistor 301 is coupled to the second terminal of the PMOS transistor 301. The first terminal of the NMOS transistor 305 is coupled to the output terminal of the source follower 216, the second terminal thereof is coupled to a bias $V_{GL}$, and the gate terminal thereof is coupled to a reference voltage $V_{ref}$.

Figure 4:
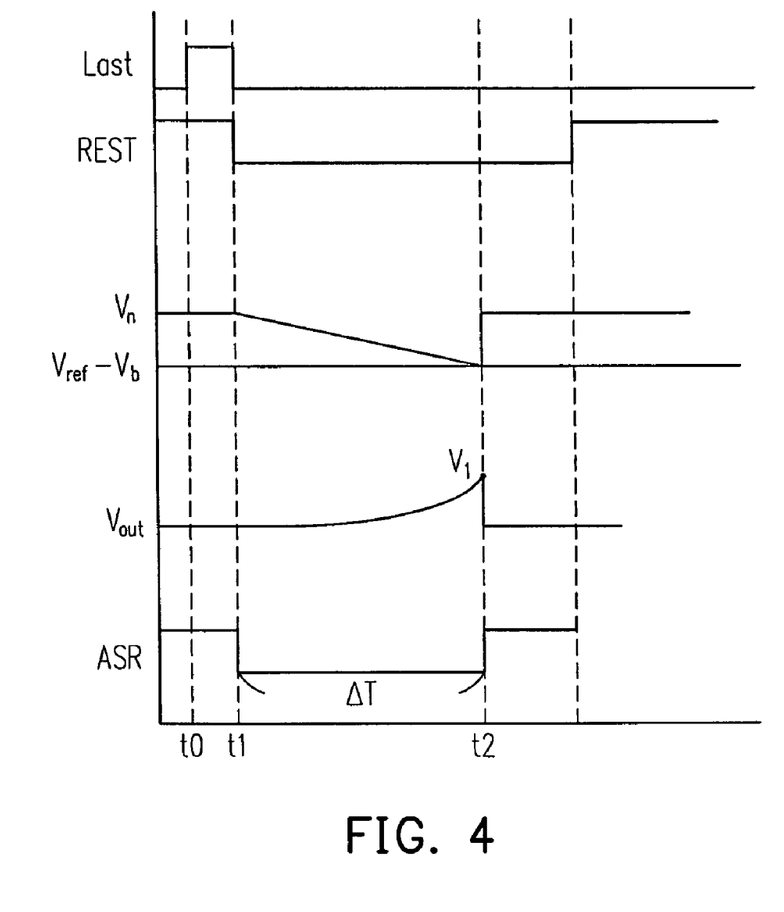
FIG. 4 is a timing diagram of signals in an ADC according to an embodiment of the present invention.

FIG. 4 is a timing diagram of the signals in the ADC illustrated in FIG. 2. Referring to both FIG. 2 and FIG. 4, in the present embodiment, the control signal REST and the control signal XREST are inverted to each other.

At time point t0, the set signal Last and the control signal REST are at high level while the control signal XREST is at low level, and the set signal Last is pulled from low level up to high level. When the control signal REST is at high level, the NMOS transistor 234 is turned on and the NMOS transistor 232 is turned off so that the node voltage $V_{out}$ is at low level and is input to an input terminal of the OR gate 236. However, the output of the OR gate 236 is at high level because the set signal Last is input to the other terminal of the OR gate 236. The output of the OR gate 236 makes the SR latch 238 to issue a high-level asynchronous latch signal ASR to the NMOS transistor 220. Accordingly, the NMOS transistor 220 is turned on so that the photo detector 218 generates a detection current $I_1$ according to the light intensity it received and charges the capacitor 222. Here the input voltage $V_n$ increases slowly.

On the other hand, the control signal REST and the control signal XREST are inverted to each other, therefore at time point to, the control signal REST is at high level and the control signal XREST is at low level, so that the switch unit 214a and the switch unit 214c are turned on and the switch unit 214b is substantially open-circuited. Because the switch unit 214a is turned on, the voltage levels at the input terminal and the output terminal of the inverter 202 are equal to a threshold voltage $V_b$, and accordingly the voltage difference between two terminals of the capacitor 204 is $V_{ref}-V_b$.

Figure 5:
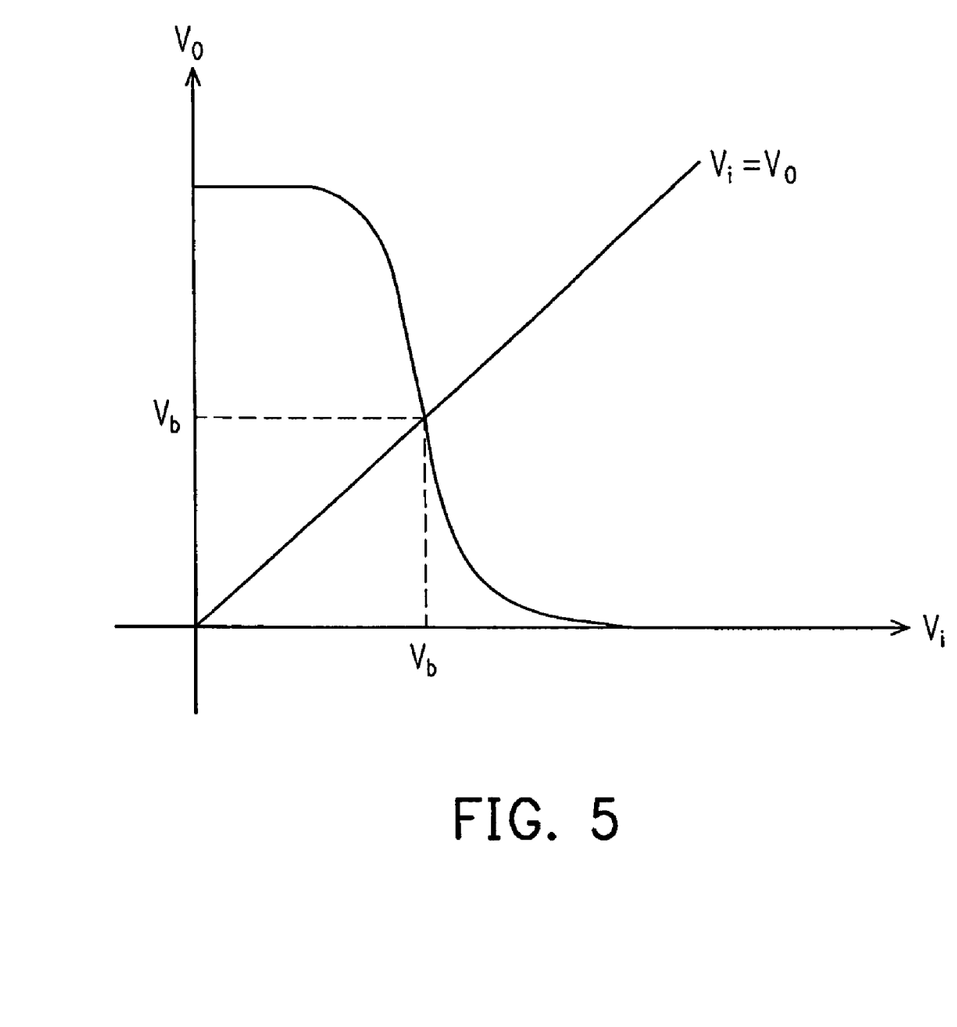
FIG. 5 illustrates an input/output characteristic curve of an inverter according to an embodiment of the present invention.

FIG. 5 illustrates an output characteristic curve of the inverter 202. Referring to FIG. 5, when the control signal REST is turned on, the voltage Vo at the output terminal of the inverter 202 is equal to the voltage Vi at the input terminal thereof. Thus, a straight line having a slope of 45° is formed in the characteristic graph of the inverter 202, and the straight line interests the characteristic curve of the inverter 202 at a particular point. The voltage Vb at this point is the threshold voltage and which will not drift along the operation time of the inverter 202.

Referring to FIG. 4 again, at time point t1, the set signal Last is pulled down to low level and the control signal REST is also transited to low level. Here because the node voltage $V_{out}$ is maintained at low level, the output of the OR gate 220 is also pulled down to low level, and accordingly the SR latch 222 issues a low-level asynchronous latch signal ASR to the NMOS transistor 220 and the D flip-flop 240. Thus, the NMOS transistor 220 is turned off and accordingly the photo detector 218 stops generating the detection current $I_1$. In addition, after the D flip-flop 240 receives the low-level asynchronous latch signal ASR, it transmits the low-level asynchronous latch signal ASR to the counter 242 according to the clock signal CLK and makes the counter 242 to start counting the time that the output of the D flip-flop 240 is at low level at time point t1.

On the other hand, because the control signal REST is transited to low level, the switch unit 214b and the NMOS transistor 232 are turned on. Correspondingly, the control signal XREST is pulled down to low level, and accordingly the switch unit 214a, the switch unit 214c, and the NMOS transistor 234 are turned off. Here, the input voltage $V_n$ charges the capacitor 204 so that the voltage difference between two terminals of the capacitor 204 is $V_n+V_b-V_{ref}$.

Initially, the input voltage $V_n$ is greater than the reference voltage $V_{ref}$, thus, the voltage at the input terminal of the inverter 202 is high level, so that the PMOS transistor 210 is turned off and the NMOS transistor 212 is turned on. Thereby, the output of the inverter 202 is at low level so that the node voltage $V_{out}$ is also maintained at low level. Here the capacitor 204 starts to discharge and accordingly the input voltage $V_n$ decreases slowly.

At time point, t2, the input voltage $V_n$ is equal to the voltage difference $V_{ref}-V_b$ at two terminals of the capacitor 204. Here, the voltage at the input terminal of the inverter 202 is at low level, so that the PMOS transistor 210 is turned on and the NMOS transistor 212 is turned off. Thereby, the output of the inverter 202 is pulled up to $V_1$ so that the node voltage $V_{out}$ also increases to $V_1$ slowly.

Accordingly, at time point t2, the output of the OR gate 236 is at high level, and accordingly the SR latch 238 issues a high-level asynchronous latch signal ASR to the D flip-flop 240. The D flip-flop 240 transmits the high-level asynchronous latch signal ASR to the counter 242 according to the clock signal CLK. When the counter 242 detects that the output of the. D flip-flop 240 is at high level, the counter 242 stops counting and output a digital signal. In the present embodiment, the digital signal records the time ΔT that the high-level asynchronous latch signal ASR is maintained at low level.

In general, the relationship between the detection current $I_1$, the input voltage $V_n$, and the time ΔT can be expressed as:

$$V_n = \frac{1}{C}I_1\Delta T$$

wherein C is the capacitance of the capacitor 222. As shown in the foregoing expression, the value of the detection current $I_1$ can be obtained based on the values of the input voltage $V_n$, the time ΔT, and the capacitance C. The detection current $I_1$ is proportional to the light intensity detected by the photo detector 218, and thus, in some embodiments of the present invention, the light intensity detected by the photo detector 218 can be obtained through a lookup table, for example.

In the embodiment described above, the inverter 202 includes a PMOS transistor 210 and an NMOS transistor 212, and a switch unit 214c is coupled between the input terminal and the output terminal of the inverter 202. Through appropriate cooperation between the PMOS transistor 210 and the NMOS transistor 212 and the fact that the voltages at the input terminal and the output terminal of the inverter 202 are the same when the switch unit 214a is turned on, the affection caused by threshold voltage drift to the comparators can be greatly reduced.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An analog-to-digital converter (ADC), comprising:
   an input module for selectively outputting an input voltage and a reference voltage;
   a first P-type metal oxide semiconductor (PMOS) transistor having a first terminal, a second terminal, and a gate terminal, wherein the first terminal of the first PMOS transistor is coupled to a first bias, and the gate terminal of the first PMOS transistor is selectively coupled to one of the input voltage and the reference voltage;
   a first N-type metal oxide semiconductor (NMOS) transistor having a first terminal, a second terminal, and a gate terminal, wherein the second terminal of the first NMOS transistor is coupled to a second bias, and the first terminal and the gate terminal of the first NMOS transistor is coupled to the second terminal and the gate terminal of the first PMOS transistor, respectively;
   a first switch unit, disposed between the second terminal and the gate terminal of the first PMOS transistor, for receiving a first control signal; and
   an output module coupled to the first terminal of the first NMOS transistor, counting a time that the input voltage is greater than the reference voltage, feeding back a second control signal to the input module, and generating a digital signal.

2. The ADC according to claim 1, wherein the first switch unit comprises a second PMOS transistor having a first terminal, a second terminal, and a gate terminal, wherein the first terminal and the second terminal of the second PMOS transistor are respectively coupled to the gate terminal and the second terminal of the first PMOS transistor, and the gate terminal of the second PMOS transistor is configured to receive the first control signal.

3. The ADC according to claim 1, wherein the input module comprises:
   a source follower having an output terminal and an input terminal;
   a capacitor coupled to the output terminal of the source follower and the gate terminal of the first PMOS transistor, respectively;
   a second switch unit having a first terminal for receiving the input voltage and a second terminal coupled to the input terminal of the source follower, wherein the second switch unit is turned on/off according to a third control signal; and
   a third switch unit having a first terminal for receiving the reference voltage and a second terminal coupled to the input terminal of the source follower, wherein the third switch unit is turned on/off according to the first control signal.

4. The ADC according to claim 3, wherein the second switch unit comprises:
   a second NMOS transistor having a first terminal, a second terminal, and a gate terminal, wherein the first terminal of the second NMOS transistor is coupled to the input voltage, the gate terminal of the second NMOS transistor is coupled to the third control signal, and the second terminal of the second NMOS transistor is coupled to the input terminal of the source follower; and
   a third PMOS transistor having a first terminal, a second terminal, and a gate terminal, wherein the first terminal of the third PMOS transistor is coupled to the input voltage, the gate terminal of the third PMOS transistor is coupled to the third control signal, and the second terminal of the third PMOS transistor is coupled to the input terminal of the source follower.

5. The ADC according to claim 3, wherein the third switch unit comprises:
   a third NMOS transistor having a first terminal, a second terminal, and a gate terminal, wherein the first terminal of the third NMOS transistor is coupled to the reference voltage, the gate terminal of the third NMOS transistor is configured to receive the first control signal, and the second terminal of the third NMOS transistor is coupled to the input terminal of the source follower; and
   a fourth PMOS transistor having a first terminal, a second terminal, and a gate terminal, wherein the first terminal of the fourth PMOS transistor is configured to receive the reference voltage, the gate terminal of the fourth PMOS transistor is configured to receive the third control signal, and the second terminal of the fourth PMOS transistor is coupled to the input terminal of the source follower.

6. The ADC according to claim 3, wherein the source follower comprises:
   a fifth PMOS transistor having a first terminal, a second terminal, and a gate terminal, wherein the first terminal of the fifth PMOS transistor is coupled to the first bias, and the gate terminal and the second terminal of the fifth PMOS transistor are coupled to each other;
   a fourth NMOS transistor having a first terminal, a second terminal, and a gate terminal, wherein the first terminal of the fourth NMOS transistor is coupled to the second terminal of the fifth PMOS transistor, and the gate terminal and the second terminal of the fourth NMOS transistor are respectively coupled to the input terminal and the output terminal of the source follower; and
   a fifth NMOS transistor having a first terminal, a second terminal, and a gate terminal, wherein the first terminal of the fifth NMOS transistor is coupled to the output terminal of the source follower, the gate terminal of the fifth NMOS transistor is coupled to the reference voltage, and the second terminal of the fifth NMOS transistor is coupled to the second bias.

7. The ADC according to claim 1, wherein the output module comprises:
   a sixth NMOS transistor having a first terminal, a second terminal, and a gate terminal, wherein the first terminal of the sixth NMOS transistor is coupled to the second terminal of the first PMOS transistor, the gate terminal of the sixth NMOS transistor is configured to receive the third control signal, and the third control signal and the first control signal are inverted to each other;
   a seventh NMOS transistor having a first terminal, a second terminal, and a gate terminal, wherein the second terminal of the seventh NMOS transistor is coupled to the second bias, the gate terminal of the seventh NMOS transistor is configured to receive the first control signal, and the first terminal of the seventh NMOS transistor is coupled to the second terminal of the sixth NMOS transistor;
   an OR gate having one input terminal coupled to a set signal and another input terminal coupled to the second terminal of the sixth NMOS transistor;

a latch having a set terminal coupled to the output terminal of the OR gate and feeding back the second control signal to the input module;
a flip-flop, coupled to the latch, for receiving the output of the latch; and
a counter, coupled to the flip-flop, for counting the output of the flip-flop and generating a digital signal.

8. An optical-to-electrical converter, comprising:
a detection module for detecting a surrounding light intensity and generating an input voltage;
a first PMOS transistor having a first terminal, a second terminal, and a gate terminal, wherein the first terminal of the first PMOS transistor is coupled to a first bias, the gate terminal of the first PMOS transistor is configured to selectively receive one of a reference voltage and the input voltage output by the detection module;
a first NMOS transistor having a first terminal, a second terminal, and a gate terminal, wherein the second terminal of the first NMOS transistor is grounded, the first terminal and the gate terminal of the first NMOS transistor are respectively coupled to the second terminal and the gate terminal of the first PMO S transistor;
a first switch unit, disposed between the second terminal and the gate terminal of the first PMOS transistor, for receiving a first control signal; and
an output module coupled to the first terminal of the first NMOS transistor, counting a time that the input voltage is greater than the reference voltage, feeding back a second control signal to the detection module, and generating a digital signal.

9. The optical-to-electrical converter according to claim 8, wherein the first switch unit comprises a second PMOS transistor having a first terminal, a second terminal, and a gate terminal, wherein the first terminal and the second terminal of the second PMOS transistor are respectively coupled to the gate terminal and the second terminal of the first PMOS transistor, and the gate terminal of the second PMOS transistor is coupled to the first control signal.

10. The optical-to-electrical converter according to claim 8, further comprising a capacitor disposed on a path through which the gate terminal of the first PMOS transistor is configured to receive the input voltage and the reference voltage.

11. The optical-to-electrical converter according to claim 10, wherein the detection module comprises:
a source follower having an output terminal and an input terminal, wherein the output terminal of the source follower is coupled to the gate terminal of the first PMOS transistor through the capacitor;
a second NMOS transistor having a first terminal, a second terminal, and a gate terminal, wherein the first terminal of the second NMO S transistor is coupled to a second bias, and the gate terminal of the second NMOS transistor is configured to receive an asynchronous latch signal;
a photo detector for detecting a surrounding light intensity and generating a current signal having a anode coupled to a third bias, and a cathode coupled to the second terminal of the second NMOS transistor, wherein the fourth bias is less than the third bias;
a second switch unit having one terminal coupled to the cathode of the photo detector for receiving the input voltage and another terminal coupled to the input terminal of the source follower, wherein the second switch unit is turned on/off according to the first control signal and a third control signal, and the third control signal and the first control signal are inverted to each other; and
a third switch unit having one terminal for receiving the reference voltage and another terminal coupled to the input terminal of the source follower, wherein the third switch unit is turned on/off according to the first control signal and the third control signal.

12. The optical-to-electrical converter according to claim 11, wherein the second switch unit comprises:
a third NMOS transistor having a first terminal, a second terminal, and a gate terminal, wherein the first terminal of the third NMOS transistor is coupled to the cathode of the photo detector, the gate terminal of the third NMOS transistor is coupled to the third control signal, and the second terminal of the third NMOS transistor is coupled to the input terminal of the source follower; and
a third PMOS transistor having a first terminal, a second terminal, and a gate terminal, wherein the first terminal of the third PMOS transistor is coupled to the cathode of the photo detector, the gate terminal of the third PMOS transistor is coupled to the first control signal, and the second terminal of the third PMOS transistor is coupled to the input terminal of the source follower.

13. The optical-to-electrical converter according to claim 11, wherein the third switch unit comprises:
a fourth NMOS transistor having a first terminal, a second terminal, and a gate terminal, wherein the first terminal of the fourth NMOS transistor is coupled to the reference voltage, the gate terminal of the fourth NMOS transistor is coupled to the third control signal, and the second terminal of the fourth NMOS transistor is coupled to the input terminal of the source follower; and
a fourth PMOS transistor having a first terminal, a second terminal, and a gate terminal, wherein the first terminal of the fourth PMOS transistor is coupled to the reference voltage, the gate terminal of the fourth PMOS transistor is coupled to the first control signal, and the second terminal of the fourth PMOS transistor is coupled to the input terminal of the source follower.

14. The optical-to-electrical converter according to claim 11, wherein the source follower comprises:
a fifth PMOS transistor having a first terminal, a second terminal, and a gate terminal, wherein the first terminal of the fifth PMOS transistor is coupled to the first bias, and the gate terminal and the second terminal of the fifth PMOS transistor are coupled to each other;
a fifth NMOS transistor having a first terminal, a second terminal, and a gate terminal, wherein the first terminal of the fifth NMOS transistor is coupled to the second terminal of the fifth PMOS transistor, and the gate terminal and the second terminal of the fifth NMOS transistor are respectively coupled to the input terminal and the output terminal of the source follower; and
a sixth NMOS transistor having a first terminal, a second terminal, and a gate terminal, wherein the first terminal of the sixth NMOS transistor is coupled to the output terminal of the source follower, the gate terminal of the sixth NMOS transistor is coupled to the reference voltage, and the second terminal of the sixth NMOS transistor is coupled to the second bias.

15. The optical-to-electrical converter according to claim 8, wherein the output module comprises:
a seventh NMOS transistor having a first terminal, a second terminal, and a gate terminal, wherein the first terminal of the seventh NMOS transistor is coupled to the second terminal of the first PMOS transistor, and the gate terminal of the seventh NMOS transistor is coupled to the third control signal, and the third control signal and the first control signal are inverted to each other;
a eighth NMOS transistor having a first terminal, a second terminal, and a gate terminal, wherein the second terminal of the eighth NMOS transistor is grounded, the gate terminal of the eighth NMOS transistor is coupled to the first control signal, and the first terminal of the eighth NMOS transistor is coupled to the second terminal of the seventh NMOS transistor;

an OR gate having one input terminal coupled to a set signal and another input terminal coupled to the second terminal of the seventh NMOS transistor;

a latch, having a set terminal coupled to the output terminal of the OR gate, for generating the second control signal according to the output of the OR gate;

a flip-flop, coupled to the latch, for receiving the second control signal; and a counter, coupled to the flip-flop, for counting the output of the flip-flop and generating a digital signal.

* * * * *